United States Patent [19]

Kato

[11] Patent Number: 5,506,849
[45] Date of Patent: Apr. 9, 1996

[54] SEMICONDUCTOR MEMORY DEVICE CAPABLE OF PERFORMING AN OVERALL TEST THEREON AT A SHORTENED TIME PERIOD

[75] Inventor: Yoshiharu Kato, Kasugai, Japan

[73] Assignees: Fujitsu Limited, Kawasaki; Fujitsu VLSI Limited, Kasugai, both of Japan

[21] Appl. No.: 214,224

[22] Filed: Mar. 17, 1994

[30] Foreign Application Priority Data

Mar. 19, 1993 [JP] Japan .................................. 5-060769

[51] Int. Cl.$^6$ ................................................. G06F 11/16
[52] U.S. Cl. ........................................................ 371/21.2
[58] Field of Search ................................. 371/21.2, 15.1, 371/16.3, 21.21, 71; 395/183.01, 183.03, 183.05, 183.06, 183.18; 365/201

[56] References Cited

U.S. PATENT DOCUMENTS 4,464,750  8/1984  Tatematse ................. 371/21.1
4,899,313  2/1990  Kumanoya et al. ....... 365/201
4,916,700  4/1990  Ito et al. .................... 371/21.1
5,148,398  9/1992  Kohno ....................... 365/201
5,361,230  11/1994  Ikeda et al. ............... 365/194

*Primary Examiner*—Hoa T. Nguyen
*Attorney, Agent, or Firm*—Armstrong, Westerman, Hattori, McLeland & Naughton

[57] ABSTRACT

Disclosed is a semiconductor memory device. A read control signal is externally input in read mode, and a test mode signal is externally input in a mode for testing memory cells. Based on the input read control signal, plural pieces of read data read out from a plurality of memory cells are latched by a plurality of latch circuits. Output signals of the latch circuits are input to a data compressor, which checks if the output signals of the latch circuits are the same and outputs a resultant signal in a form of compressed data of one bit. The output signal of the data compressor is input to an output circuit, which outputs the output signal of the data compressor based on the input test mode signal. A preset circuit allows the latch circuits to latch different pieces of data based on the test mode signal and the read control signal.

8 Claims, 6 Drawing Sheets

SEMICONDUCTOR MEMORY DEVICE CAPABLE OF PERFORMING AN OVERALL TEST THEREON AT A SHORTENED TIME PERIOD

BACKGROUND OF THE INVENTION

1. Field of the Invention

The present invention relates to a semiconductor memory device having a test mode circuit.

2. Description of the Related Art

Recently, semiconductor memory devices have been designed with increasingly larger memory capacities. With this increase in memory capacity, the time needed for testing whether the semiconductor memory cells function properly also tends to increase. Unfortunately, this increase in time, in turn, results in higher testing costs. It is consequently desirable to shorten the time needed for testing.

FIG. 1 exemplifies the data output section of a conventional semiconductor memory device equipped with a test mode circuit. Read data bar D1 to bar Dn of n bits from selected memory cells are input to n latch circuits L1 to Ln bit by bit. The latch circuits L1–Ln latch the read data bar D1–bar Dn and output those data as latched data DL1 to DLn to a data compressor 1 and a decoder 2. The latched data DL1–DLn compressed by data compressor 1 includes, for example, eight bits to one bit. The results, as compressed data, are output as signal $\phi$DC. In detail, the data compressor 1 outputs an H-level output signal $\phi$DC to a selector 3 when 8-bit latched data DL1–DLn have the same value, and outputs an L-level output signal $\phi$DC to the selector 3 when otherwise. The decoder 2 receives a column address signal AD based on which, the decoder 2 selects one of the latched data DL1–DLn and outputs it as an output signal $\phi$DD to the selector 3.

The selector 3 also receives a test mode signal $\phi$T, which goes high during any testing operation, i.e., during any test mode. When the H-level test mode signal $\phi$T is input to the selector 3, the selector 3 outputs the output signal $\phi$DC of the data compressor 1 as an output signal $\phi$DATA to an output circuit 4. In a normal mode, which differs from that of the test mode, a L-level test mode signal $\phi$T is input to the selector 3. Based on this L-level test mode signal $\phi$T, the selector 3 outputs the output signal $\phi$DD of the decoder 2 as the output signal $\phi$DATA to the output circuit 4. The output circuit 4 receives an output control signal $\phi$RSD. When this signal $\phi$RSD goes high, the output circuit 4 is activated to output the output signal $\phi$DATA of the selector 3 as an output signal Dout.

FIG. 2 graphically illustrates the operation of the above described data output section. In normal mode, the test mode signal $\phi$T is at a L level. Reading operations start when control signal bar RAS falls. The output control signal $\phi$RSD goes high after a predetermined time from the falling of the control signal bar RAS, while the output circuit 4 is activated in response to the H-level output control signal $\phi$RSD. Subsequently, read data bar D1 to bar Dn, read from the selected memory cells, are latched by the respective latch circuits L1 to Ln, which then output the output signals DL1 to DLn. The decoder 2 outputs one of the output signals DL1–DLn from the latch circuits L1–Ln as the output signal $\phi$DD, based on the column address signal AD. The selector 3 sends out the output signal $\phi$DD of the decoder 2 as the output signal $\phi$DATA to the output circuit 4, which then outputs this signal $\phi$DATA as the output signal Dout.

In test mode, the test mode signal $\phi$T first goes high, and then the reading operation starts at the timing of the falling of the control signal bar RAS. In test mode, since the same data has already been written in the individual memory cells, the output control signal $\phi$RSD goes high after a predetermined time from the falling of the control signal bar RAS. This renders the output circuit 4 active. Subsequently, read data bar D1 to bar Dn, read from the selected memory cells, are latched by the respective latch circuits L1 to Ln, which then output the output signals DL1 to DLn. The data compressor 1 compresses the latched data DL1–DLn, for example, eight bits to one bit, and outputs the resultant data. More specifically, the data compressor 1 either, outputs an H-level output signal $\phi$DC when the 8-bit latched data DL1–DLn coincide with each another, or outputs an L-level output signal $\phi$DC when those data do not match with one another. The selector 3 outputs signal $\phi$DC of the data compressor 1 as signal $\phi$DATA to the output circuit 4. Circuit 4, in turn, outputs this signal $\phi$DATA as the output signal Dout.

Such a data output section as described above cannot perform an operational test on the individual memory cells to measure the access time required for the simultaneous reading of data during a test mode. During a test of the individual memory cells, all the memory cells have the same data previously provided to them. Consequently, the cell information read from each memory cell should be the same. When the individual memory cells properly function, the output signals DL1 to DLn from the latch circuits L1 to Ln always have the same value, and the output signal $\phi$DC, which is output from the data compressor 1 based on the output signals DL1–DLn, should always go high. Consequently, if the individual memory cells are functioning properly, the output signal Dout of the output circuit 4 goes high based on the old data latched by the individual latch circuits L1–Ln. Then, the output signal Dout is kept at the H level based on new data that is read out at the falling of the control signal bar RAS. Since the level of the output signal Dout is kept high, it is impossible to measure the access time required for a reading operation from when the control signal bar RAS falls till that time when the output signal Dout is output.

Due to this restriction, semiconductor memory devices containing the above-described data output section design, must measure cell access time in a procedure separate from that for testing the function of the memory cells. Measuring cell access time is accomplished by reading data bit by bit without using the test mode. If there is a possibility that old cell data coincides with new cell data, access time can not be measured accurately. At the time of measuring the access time, therefore, data different from the data to be read out should be held previously in the latch circuits L1 to Ln. Due to this restriction, the above-described test mode for allowing the data compressor 1 to compress and check the output signals DL1 to DLn of the latch circuits L1–Ln cannot be used. Therefore, it is necessary to measure the access times for many memory cells individually. This increases the time needed for testing the memory function and increases the testing costs.

SUMMARY OF THE INVENTION

It is therefore an object of the present invention to perform an operation test to measure the access time of a semiconductor memory device at the same time as an operation test on the individual memory cells, thus shortening the time required for the overall operation test.

To achieve the foregoing objective, according to the present invention, a read control signal is externally input in read mode, and a test mode signal is externally input in a mode for testing memory cells. Based on the input read control signal, plural pieces of read data read out from a plurality of memory cells are latched by a plurality of latch circuits. Output signals of the latch circuits are input to a data compressor, which checks if the output signals of the latch circuits are the same and outputs a resultant signal in a form of compressed data of one bit. The output signal of the data compressor is input to an output circuit, which outputs the output signal of the data compressor based on the input test mode signal. A preset circuit allows the latch circuits to latch different pieces of data based on the test mode signal and the read control signal.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

Figure 7:
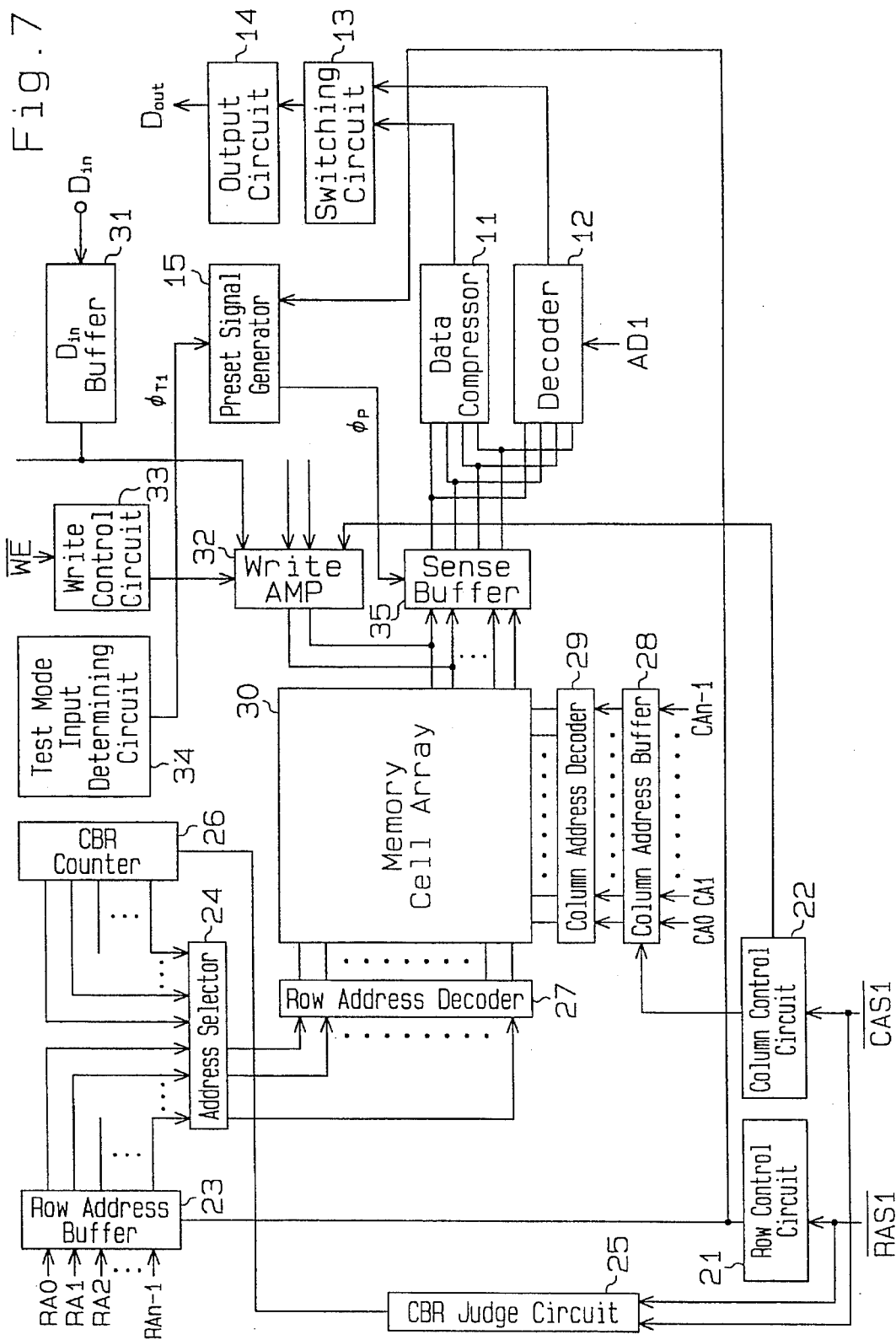
FIG. 7 is a block diagram showing a semiconductor memory device embodying this invention.

A preferred embodiment of a DRAM according to the present invention will now be described referring to the accompanying drawings. FIG. 7 shows the entire structure of DRAM. A control signal bar RAS1, input from the outside of the DRAM, is coupled to a row control circuit 21. A control signal bar CAS1, input from the outside of DRAM, is coupled to a column control circuit 22. An output signal from the row control circuit 21 is coupled to a row address buffer 23. Responsive to the output signal from the row control circuit 21, the row address buffer 23 latches row address signals RA0 through $RA_{n-1}$ as output to an address selector 24. The control signals bar RAS1 and bar CAS1 are coupled to a CBR judge circuit 25. The CBR judge circuit 25 detects trailing edges of the control signal bar RAS1 and bar CAS1 to output to a CBR counter 26. The CBR counter 26 counts output signals from the CBR judge circuit 25 to output the counted number of the output signals to the address selector 24. The address selector 24 transfers output signals from the row address buffer 23 to the row address decoder 27 during normal writing and reading operations, while transferring output signals from the CRB counter 26 to the row address decoder 27 during self-refresh operation.

An output signal from the column control circuit 22 is transferred to a column address buffer 28. In response to the output signal from the column control circuit 22, the column address buffer 28 latches the column address signals CA0 through $CA_{n-1}$ to output to a column address decoder 29. A memory cell array 30 includes a plurality of memory cells, word lines and bit lines used for selecting each of the cells, and sense amplifiers. In response to the output signals from the row address decoder 27 and column address decoder 29, a specific cell can be selected.

Write data Din input from the outside of the DRAM is coupled to an input buffer circuit 31. Output signal from the input buffer circuit 31 is coupled to a write amplifier 32. Write control signal bar WE input from the outside of the DRAM is coupled to a write control circuit 33, which outputs an activation signal to the write amplifier 32 responsive to the write control signal bar WE. During writing operations, the activated write amplifier 32 outputs the write data to the memory cell array 30 to perform the writing operations to the selected memory cell.

A test mode input determining circuit 34 receives a signal for setting a test mode from the outside of the DRAM. In response to the signal, the circuit 34 outputs a test mode signal ϕT1 to a preset signal generating circuit 15 and a switching circuit 13. A data output section includes a sense buffer 35 to which cell information read out from the memory cell array 30 are input, a data compression circuit 11, a decoder 12, the switching circuit 13 and an output circuit 14.

Figure 1:
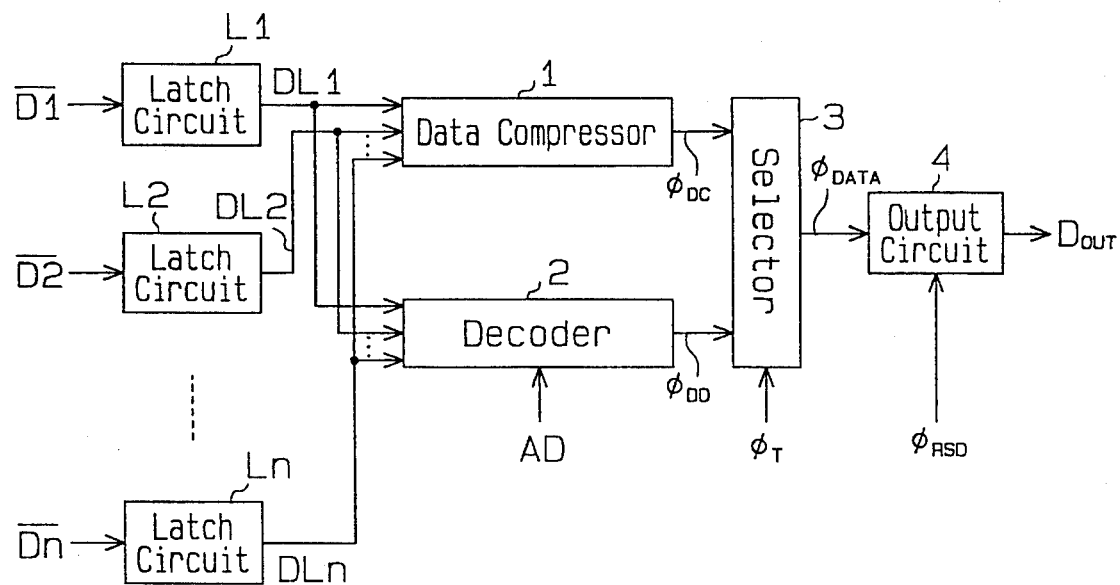
FIG. 1 is a block diagram illustrating a data output section of a conventional semiconductor memory device.
Figure 2:
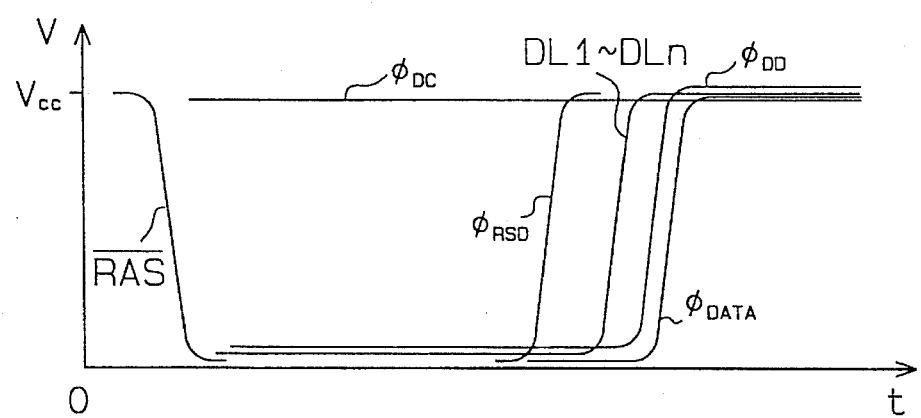
FIG. 2 is a waveform diagram showing the operation of the data output section of the prior art.
Figure 3:
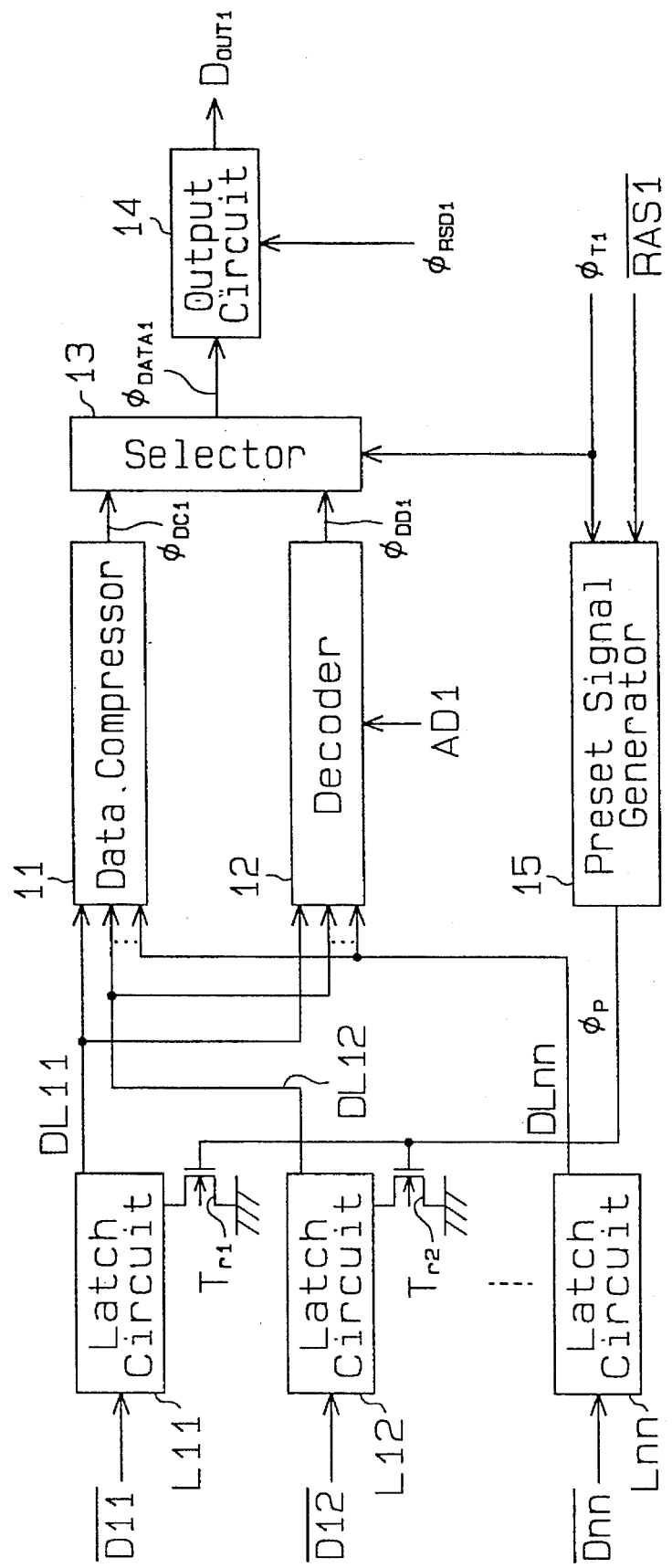
FIG. 3 is a block diagram illustrating a data output section according to one embodiment of the present invention.

FIG. 3 shows the data output section. Read data bar D11 to bar Dnn of n bits are input to latch circuits L11 to Lnn bit by bit. The latch circuits L11–Lnn latch the read data bar D11–bar Dnn and output those data as output signals DL11 to DLnn to a data compressor 11 and a decoder 12. The data compressor 11 compresses the output signals DL11–DLnn, for example, eight bits to one bit, and outputs the resultant data as an output signal ϕDC1. The decoder 12 receives a column address signal AD1. Based on this column address signal AD1, the decoder 12 selects one of the output signals DL11–DLnn and outputs it as an output signal ϕDD1 to a selector 13.

The selector 13 also receives a test mode signal ϕT1, which becomes an H level in test mode. Based on the H-level test mode signal ϕT1, the selector 13 outputs the output signal ϕDC1 of the data compressor 11 as an output signal ϕDATA1 to an output circuit 14. In normal mode different from the test mode, an L-level test mode signal ϕT1 is input to the selector 13. Based on this L-level test mode signal ϕT1, the selector 13 outputs the output signal ϕDD1 of the decoder 12 as the output signal ϕDATA1 to the output circuit 14. The output circuit 14 receives an output control signal ϕRSD1, which is produced based on a control signal bar RAS1. When this signal ϕRSD1 goes high, the output circuit 14 outputs the output signal ϕDATA1 of the selector 13 as an output signal Dout1. The control signal bar RAS1 and the test mode signal ϕT1 are also input to a preset signal generator 15. The preset signal generator 15 outputs a preset signal ϕP to the gates of two N channel MOS transistors Tr1 and Tr2 based on the control signal bar RAS1 and the test mode signal ϕT1.

Figure 4:
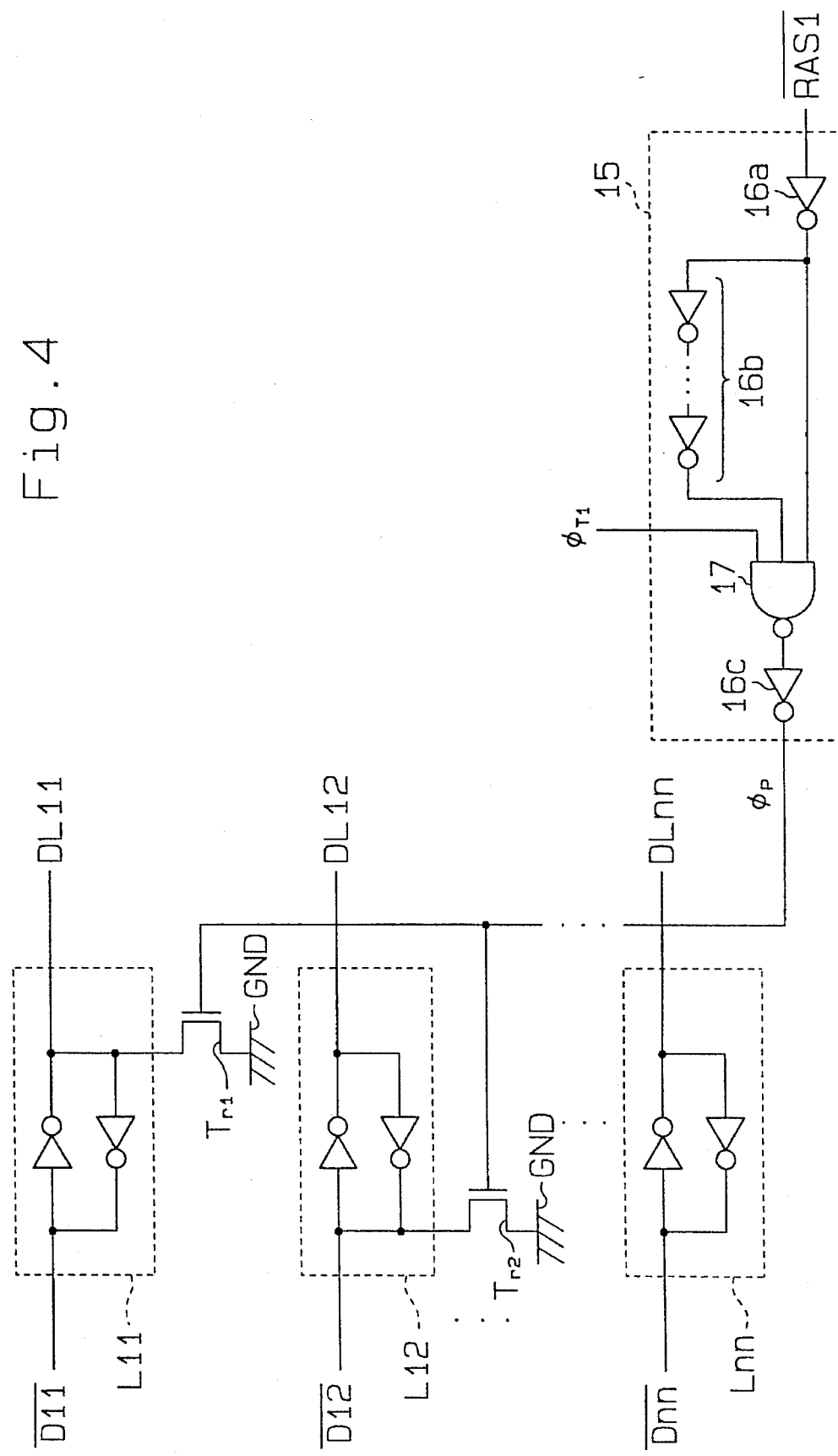
FIG. 4 is a circuit diagram showing latch circuits and a preset signal generator in the data output section shown in FIG. 3.

The specific structures of the preset signal generator 15 and the individual latch circuits L11 to Lnn will now be described with reference to FIG. 4. The control signal bar RAS1 is input to an inverter 16a which is one component of the preset signal generator 15. The output signal of the inverter 16a is input directly to a NAND gate 17, and is also input via odd-numbered stages of inverters 16b to the NAND gate 17. The NAND gate 17 also receives the aforementioned test mode signal φT1. When the test mode signal φT1 goes low during normal mode, and the output signal of the NAND gate 17 goes high irrespective of the control signal bar RAS1. When the control signal bar RAS1 goes high from a L level with the test mode signal φT1 being at an H level, the output signal of the NAND gate 17 falls to an L level from the H level. This output signal returns to the H level after the time corresponding to an operational delay, provided by the inverters 16b, elapses.

The output signal of the NAND gate 17 is output as the preset signal φP to the gates of the transistors Tr1 and Tr2 via an inverter 16c. Each of the latch circuits L11 to Lnn comprises two inverters. The output terminal of the latch circuit L11 is connected to the ground GND via the transistor Tr1, while the input terminal of the latch circuit L12 is connected to the ground GND via the transistor Tr2. As mentioned above, the preset signal φP is input to the gates of the transistors Tr1 and Tr2. When the preset signal φP goes high, the output signal of the latch circuit L11 will go low regardless of the read data bar D11. The output signal of the latch circuit L12 goes high regardless of the read data bar D12. Accordingly, the preset signal generator 15 and the transistors Tr1 and Tr2 constitute a preset circuit which sets the output signals DL11 and DL12 from the latch circuits L11 and L12 at a complementary signal.

Figure 5:
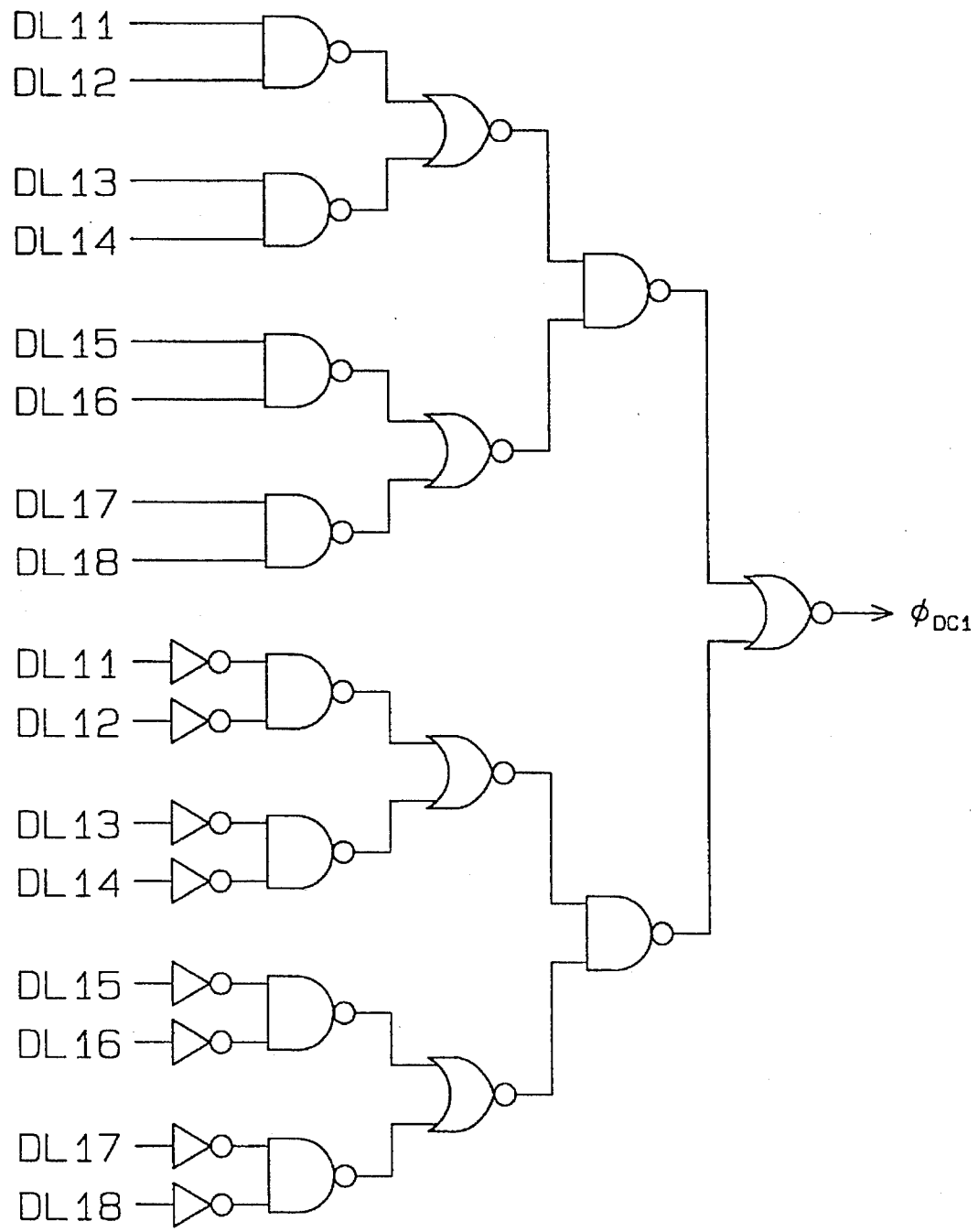
FIG. 5 is a circuit diagram showing a data compressor latch circuits in the data output section shown in FIG. 3.

FIG. 5 shows the data compressor 11 having an 8-bit structure. The output signals DL11 to DL18 of the latch circuits L11 to L18 are input to four NAND gates via eight inverters. When the output signals DL11–DL18 of the latch circuits L11–L18 become the same data, the output signal φDC1 of the data compressor 11 goes high. When the output signals DL11–DL18 of the latch circuits L11–L18 are not the same, the output signal φDC1 goes low.

Figure 6:
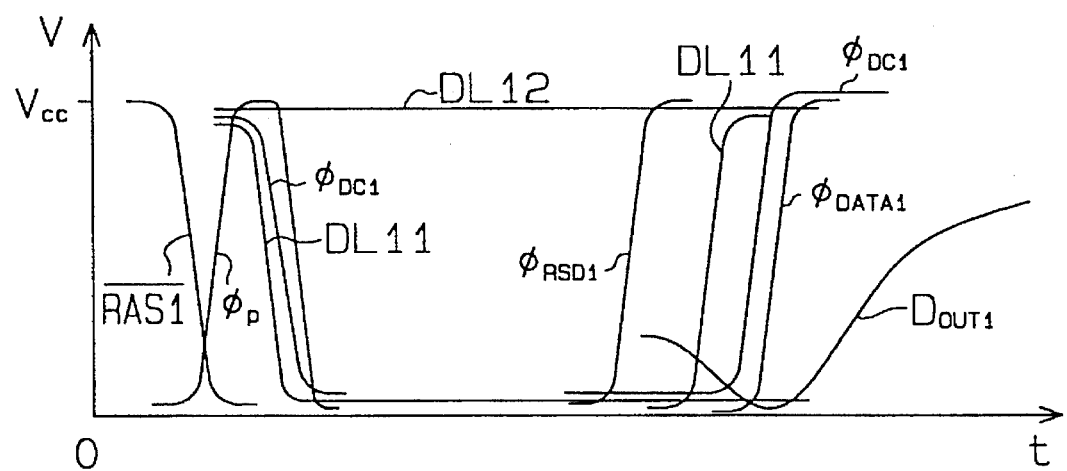
FIG. 6 is a waveform diagram showing the operation of the data output section shown in FIG. 3.

The function of the data output section, as described above, will now be discussed referring to FIG. 6. In test mode, the H-level test mode signal φT1 is input to the NAND gate 17 of the preset signal generator 15. The NAND gate 17 is then set to wait for the output signals of the inverters 16a and 16b. When the control signal bar RAS1 falls to an L level from an H level, the preset signal generator 15 outputs, as the preset signal φP, a pulse signal which goes high for a predetermined period of time from the falling of the control signal bar RAS1. Consequently, the transistors Tr1 and Tr2 are turned on, causing the output signal DL11 of the latch circuit L11 to go low irrespective of the data latched by circuit L11. Further, the output signal DL12 of the latch circuit L12 goes high irrespective of the data latched by circuit L12. As a result, the output signals DL11–DLnn of the latch circuits L11–Lnn will not be the same, irrespective of the data those circuits have been holding. Thus, the output signal φDC1 of the data compressor 11 will go low.

When the output control signal φRSD1 goes high to render the output circuit 14 active under the above condition, the output signal Dout1 becomes an L level first based on the L-level output signal φDC1 of the data compressor 11. Then, through a reading operation which is performed at the timing of the falling of the control signal bar RAS1, the same data previously written in the individual memory cells are read out as read data bar D11 to bar Dnn from the selected memory cells. Consequently, the output signal DL11–DLnn of the latch circuits L11–Lnn will represent the same data, and the output signal φDC1 of the data compressor 11 becomes an H level. The output signal φDC1 is input as the output signal φDATA1 to the output circuit 14 via the selector 13, causing the output signal Dout1 of the output circuit 14 to go high from a previous L level. Therefore, the access time required to read cell information can be detected by measuring the time from the point when the control signal bar RAS1 has risen to the point when the output signal Dout1 of the output circuit 14 has risen to a predetermined level. This can be done using testing equipment. In normal mode, on the other hand, the test mode signal φT1 goes low, causing the preset signal φP to go to a L level. The transistors Tr1 and Tr2 therefore remain turned off, allowing the latch circuits L1 and L2 to function in the same manner as the other latch circuits L3 to Ln.

As described above, in test mode, the output signal Dout1 of the output circuit 14 in the data output section is reset to an L level every time the control signal bar RAS1 falls to an L level. When the same data is read out from those memory cells which are functioning properly, at the timing of the falling of the control signal bar RAS1, the level of the output signal Dout1 goes high. If the output signal Dout1 goes high, it is possible to measure the access time required for reading cell information as well as to confirm that the selected memory cells of a plurality of bits are properly functioning. This will shorten the time needed for the functional test on the memory cells and measuring the access time, thereby reducing the testing cost. What is more, this embodiment can be accomplished by a very simple structure which has the preset signal generator 15 and transistors Tr1 and Tr2 added simply to the above-described prior art. Although the preset signal generator 15 is controlled by the control signal bar RAS1, it may be designed to be controllable by another control signal input from an internal circuit or an external circuit.

What is claimed is:

1. A semiconductor memory device, comprising:

a plurality of memory cells having data stored therein;

a plurality of latch circuits for reading and latching said data from said plurality of memory cells, said data being read and latched by said plurality of latch circuits based on a read control signal;

data compressor for receiving output signals of said latch circuits, and checking if logic levels of said output signals of said latch circuits are the same and outputting a compressor signal indicative of the results of said checking;

an output circuit means responsive to said compressor signal and a test mode signal, for detecting whether each of said memory cells functions as desired; and a preset circuit means, responsive to said test mode signal and to said read control signal, for outputting a preset signal enabling at least one of said latch circuits to latch data at a logic level different from that latched by said latch circuits prior to said preset signal by said preset circuit.

2. The semiconductor memory device according to claim 1, wherein each of said latch circuits comprises two CMOS inverters each having an output terminal connected to an input terminal of the other inverter.

3. The semiconductor memory device according to claim 1, wherein said data compressor outputs an H-level signal when said output signals of said latch circuits are the same, and outputs an L-level signal when otherwise.

4. The semiconductor memory device according to claim 1, wherein said preset circuit means comprises a preset signal generator for generating a preset signal based on said test mode signal being at a H level and on a decrease of said read control signal, and a switch circuit, which when enabled in response to said preset signal, sets said output signal of each of said latch circuits to one of H level and an L level.

5. A semiconductor memory device, comprising:

a plurality of memory cells having data stored therein;

a plurality of latch circuits for reading and latching a plurality of said data from said plurality of memory cells, said data being read and latched by said plurality of latch circuits based on a read control signal;

a data compressor for: (a) receiving output signals of said latch circuits, (b) outputting one of an H-level and an L-level logic signals when said output signals of said latch circuits are the same, and (c) outputting the other of said H-level and L-level logic signals when said output signals of said latch circuits are unequal;

an output circuit for outputting an input signal from said data compressor based on a test mode signal;

a preset signal generator for generating, when said read control signal decreases, a preset signal based on said test mode signal; and a switch circuit responsive to said preset signal for enabling each of said latch circuits to latch data at a logic level different from that latched by said latch circuits prior to the output of said preset signal by said preset circuit.

6. The semiconductor memory device according to claim 5, wherein said preset signal generator comprises:

an NAND gate for receiving said test mode signal;

a first inverter for receiving said read control signal and outputting an output signal to said NAND gate;

odd-numbered stages of second inverters connected in series, for receiving said output signal of said first inverter and outputting output signals to said NAND gate; and a third inverter for receiving an output signal of said NAND gate and outputting said preset signal.

7. The semiconductor memory device according to claim 5, wherein said switching circuit comprises:

a first N channel MOS transistor, connected between an output terminal of a first one of said latch circuits and ground and having a gate supplied with said preset signal; and a second N channel MOS transistor, connected between an output terminal of a second one of said latch circuits and ground and having a gate supplied with said preset signal.

8. A semiconductor memory device comprising:

a plurality of memory cells having data stored therein;

a plurality of latch circuits for reading and latching a plurality of said data from said plurality of memory cells, said data being read and latched by said plurality of latch circuits based on a read control signal externally inputted in read mode, each of said latch circuits including two CMOS inverters each having an output terminal connected to an input terminal of the other inverter;

a data compressor for: (a) receiving output signals of said latch circuits, (b) outputting an H level signal when said output signals of said latch circuits are the same, and (c) outputting an L level signal when said output signals of said latch circuits are unequal;

an output circuit for outputting an input signal from said data compressor based on a test mode signal externally input in a mode for testing said memory cells;

a NAND gate for receiving said test mode signal;

a first inverter for receiving said read control signal and outputting an output signal to said NAND gate;

odd-numbered stages of second inverters connected in series, for receiving said output signal of said first inverter and outputting output signals to said NAND gate;

a third inverter for receiving an output signal of said NAND gate and outputting a preset signal;

a first N channel MOS transistor, connected between an output terminal of a first one of said latch circuits and ground and having a gate supplied with said preset signal;

a second N channel MOS transistor, connected between an output terminal of a second one of said latch circuits and ground and having a gate supplied with said preset signal; and a switch circuit for setting said output signals of said latch circuits to an H level or an L level, when enabled in response to said preset signal.

* * * * *